(12) United States Patent
Suzuki et al.

(10) Patent No.: US 12,300,553 B2
(45) Date of Patent: May 13, 2025

(54) METHOD FOR EVALUATING SEMICONDUCTOR WAFER, METHOD FOR SELECTING SEMICONDUCTOR WAFER AND METHOD FOR FABRICATING DEVICE

(71) Applicant: SHIN-ETSU HANDOTAI CO., LTD., Tokyo (JP)

(72) Inventors: Junya Suzuki, Annaka (JP); Masakazu Sato, Nishigo-mura (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 201 days.

(21) Appl. No.: 17/769,572

(22) PCT Filed: Sep. 14, 2020

(86) PCT No.: PCT/JP2020/034616
§ 371 (c)(1),
(2) Date: Apr. 15, 2022

(87) PCT Pub. No.: WO2021/084939
PCT Pub. Date: May 6, 2021

(65) Prior Publication Data
US 2024/0128130 A1    Apr. 18, 2024

(30) Foreign Application Priority Data

Oct. 31, 2019    (JP) .................. 2019-199189

(51) Int. Cl.
*H01L 21/66* (2006.01)
*C30B 30/00* (2006.01)
(Continued)

(52) U.S. Cl.
CPC .............. *H01L 22/20* (2013.01); *C30B 30/00* (2013.01); *G01N 21/47* (2013.01); *H01L 22/12* (2013.01); *G01B 21/20* (2013.01); *G01B 2210/56* (2013.01)

(58) Field of Classification Search
CPC ....... H01L 22/20; H01L 22/12; H01L 21/304; H01L 21/02024; G01N 21/47; C30B 30/00; B24B 49/02; G01B 21/20; G01B 2210/56
See application file for complete search history.

(56) References Cited

U.S. PATENT DOCUMENTS 6,613,591 B1 * 9/2003 Bhagavat .............. B24B 37/005
                                                                438/460
7,209,857 B2 * 4/2007 Sato ........................ G01B 7/08
                                                                702/155
(Continued)

FOREIGN PATENT DOCUMENTS

JP    11287630 A  * 10/1999
JP    H11-287630 A   10/1999
(Continued)

OTHER PUBLICATIONS

Nov. 24, 2020 International Search Report issued in International Patent Application No. PCT/JP2020/034616.
(Continued)

*Primary Examiner* — Michael M Trinh
(74) *Attorney, Agent, or Firm* — Oliff PLC

(57) ABSTRACT

An evaluation method including steps of: acquiring profile measurement data on an entire surface in a thickness direction of a mirror-polished wafer; identifying a slice-cutting direction by performing first-order or second-order differentiation on diameter-direction profile measurement data on the wafer to acquire differential profiles at predetermined rotation angles and pitches, and comparing the acquired
(Continued)

differential profiles; acquiring x-y grid data by performing first-order or second-order differentiation on profile measurement data at a predetermined pitch in a y-direction at a predetermined interval in an x-direction perpendicular to the y-direction, which is the identified slice-cutting direction; acquiring, from the x-y grid data, a maximum derivative value in an intermediate region including the wafer center in the y-direction and a maximum derivative value in upper-end-side and lower-end-side regions located outside the intermediate region; and judging failure incidence possibility in a device fabrication process based on the maximum derivative values.

19 Claims, 3 Drawing Sheets

(51) Int. Cl.
*G01N 21/47* (2006.01)
*G01B 21/20* (2006.01)

(56) References Cited

U.S. PATENT DOCUMENTS

| | | | |
|---|---|---|---|
| 2004/0215418 A1* | 10/2004 | Kobayashi | G01B 11/24 |
| | | | 702/167 |
| 2005/0255610 A1 | 11/2005 | Sato et al. | |
| 2008/0166823 A1* | 7/2008 | Okabe | H01L 22/12 |
| | | | 702/167 |
| 2011/0160891 A1* | 6/2011 | Pitney | G01B 21/30 |
| | | | 703/1 |
| 2023/0339069 A1* | 10/2023 | Istratov | B24B 9/065 |

FOREIGN PATENT DOCUMENTS

| | | |
|---|---|---|
| JP | 2004-020286 A | 1/2004 |
| JP | 2019-067952 A | 4/2019 |

OTHER PUBLICATIONS

May 3, 2022 International Preliminary Report on Patentability issued in International Patent Application No. PCT/JP2020/034616.

\* cited by examiner

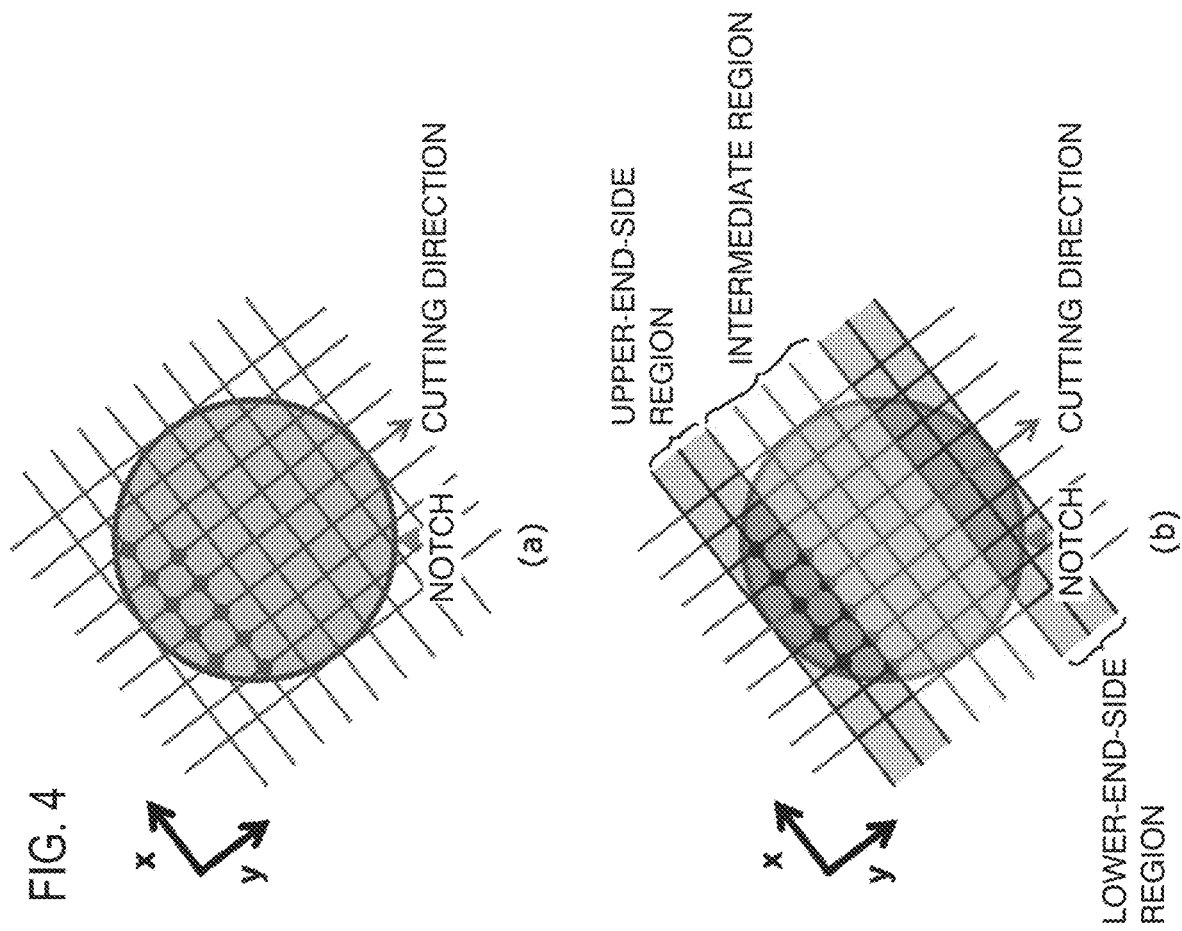
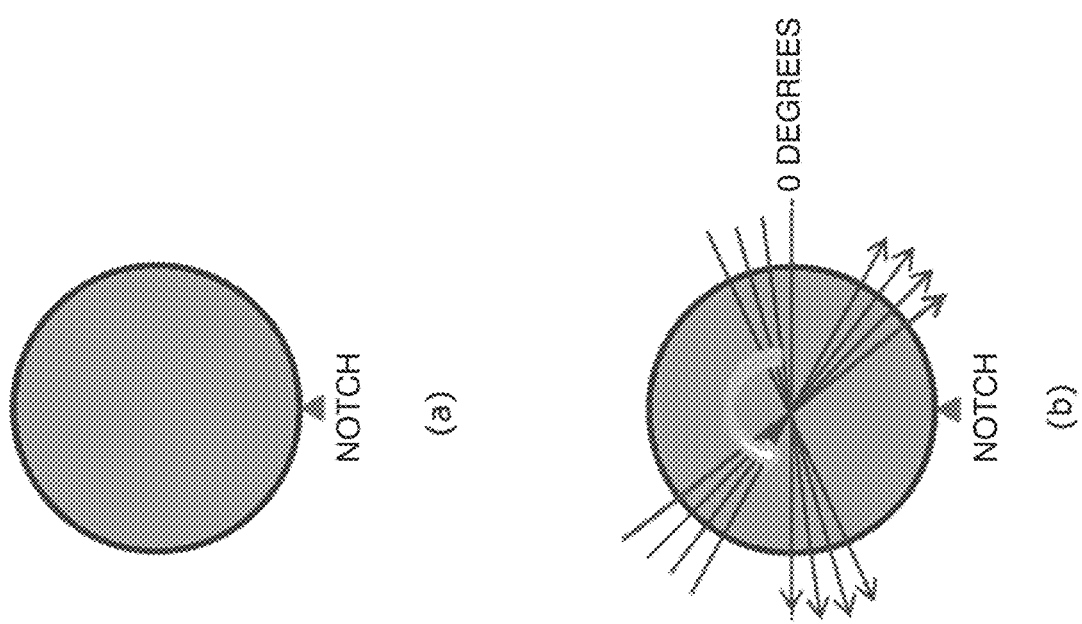

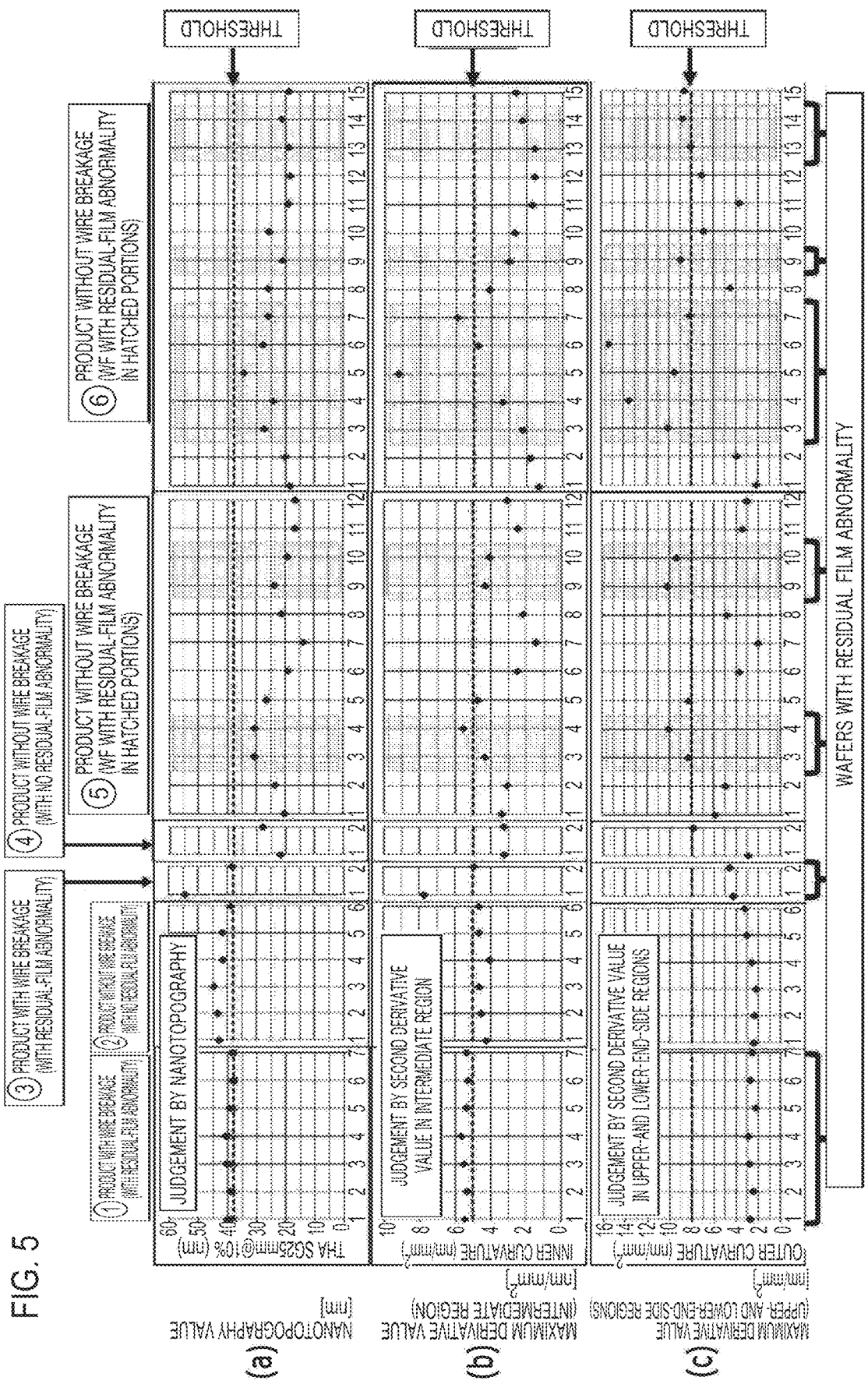

METHOD FOR EVALUATING SEMICONDUCTOR WAFER, METHOD FOR SELECTING SEMICONDUCTOR WAFER AND METHOD FOR FABRICATING DEVICE

TECHNICAL FIELD

The present invention relates to a method for evaluating a semiconductor wafer, a method for selecting a semiconductor wafer, and a method for fabricating a device.

BACKGROUND ART

Nowadays, abnormality related to residual film is reported in relation to a CMP step in device fabrication processes, which results in uneven film thickness after the polishing. The main cause is considered to be peculiar wavy shape that appears in a direction in which an ingot is cut with a wire saw in a slicing step of wafer manufacturing processes. The presence of such peculiar wavy shape causes a difference in polishing stock removal between a convex portion and a concave portion of a wafer, consequently causing uneven film thickness after polishing.

CITATION LIST

Patent Literature

Patent Document 1: JP 2004-20286 A

SUMMARY OF INVENTION

Technical Problem

In device fabrication processes, screening for wafers having wavy shape that causes residual film abnormality requires identifying a slice-cutting direction of a wire saw. However, such method has not been established yet. Hence, screening by nanotopography has been attempted, but the nanotopography just expresses a minute asperity on the entire wafer surface by one numerical value, and cannot identify the slice-cutting direction.

Meanwhile, Patent Document 1 discloses a method of evaluating a surface shape of a wafer by utilizing the differentiated shape in a diameter direction of the entire surface. However, this aims to quantitatively evaluate a shape of a semiconductor wafer, particularly a shape of a peripheral portion of the wafer, from a viewpoint different from conventional wafer shape qualities such as SFQR, and cannot identify the slice-cutting direction required for the detection of peculiar wavy shape.

Accordingly, as an alternative approach to nanotopography and conventional wafer shape evaluation, there are needs for the development of a method enabling effective detection, evaluation, and screening for peculiar wavy shape attributable to slicing step.

The present invention has been made to solve the above problems. An object of the present invention is to provide a method for evaluating a semiconductor wafer by precisely and easily identifying a slice-cutting direction to enable effective detection and evaluation of peculiar wavy shape which is attributable to slicing step, and which has influence on failure incidence in a device fabrication process.

Solution to Problem

The present invention has been made to achieve the object, and provides a method for evaluating a semiconductor wafer, wherein a mirror-polished wafer is used as the semiconductor wafer, and the method comprises:

a step of acquiring profile measurement data by measuring a profile of an entire surface in a thickness direction of the mirror-polished wafer with a wafer-profile measurement system;

a step of identifying a slice-cutting direction of the mirror-polished wafer by extracting diameter-direction profile measurement data from the profile measurement data on the entire surface of the mirror-polished wafer, performing first-order or second-order differentiation on the extracted diameter-direction profile measurement data at a predetermined pitch to acquire differential profiles of the diameter-direction profile measurement data at predetermined rotation angles over the entire surface of the mirror-polished wafer, and comparing the acquired differential profiles of all pieces of the diameter-direction profile measurement data to determine that a diameter direction of the differential profile including a maximum derivative value is the slice-cutting direction;

a step of acquiring x-y grid data by setting rectangular coordinates with coordinate axes being the identified slice-cutting direction and a direction perpendicular to the identified slice—cutting direction, performing first-order or second-order differentiation on profile measurement data at a predetermined pitch in a y-direction at a predetermined interval in an x-direction, where the y-direction is the identified slice-cutting direction, and the x-direction is the direction perpendicular to the identified slice-cutting direction, and forming an x-y grid with predetermined intervals in the x-direction and the y-direction;

a step including setting an intermediate region including a center of the mirror-polished wafer in the y-direction of the mirror-polished wafer and an upper-end-side region and a lower-end-side region located outside the intermediate region, and acquiring a maximum derivative value in the intermediate region of the mirror-polished wafer and a maximum derivative value in the upper-end-side region and the lower-end-side region of the mirror-polished wafer from the acquired x-y grid data; and a step of judging whether or not there is a possibility of failure incidence in a device fabrication process based on the maximum derivative value in the intermediate region and the maximum derivative value in the upper-end-side region and the lower-end-side region.

Such a method for evaluating a semiconductor wafer enables precise identification of the slice-cutting direction in a convenient manner, and precise and convenient judgement of whether or not there is a failure incidence possibility in a device fabrication process due to the influence of peculiar wavy shape attributable: to slicing step, the judgement being made on the basis of the identified slice-cutting direction.

In this method for evaluating a semiconductor wafer, the extraction of the diameter-direction profile measurement data and the acquisition of the differential profiles can be performed at a predetermined rotation angle that is an interval of 0.5 to 10°.

Thereby, the slice-cutting direction of a mirror-polished wafer can be identified more precisely and efficiently.

In this method for evaluating a semiconductor wafer, the predetermined intervals in the x-direction and the y-direction in the x-y grid can be 0.5 to 2 mm. Further, in the method for evaluating a semiconductor wafer, the predetermined pitch in the y-direction in the x-y grid can be 2 to 10 mm.

These more effectively and efficiently enable precise and convenient judgement of failure incidence possibility in a device fabrication process.

In this method for evaluating a semiconductor wafer, a flatness measurement system or a nanotopography measurement system is usable as the wafer-profile measurement system.

These can acquire more precise profile measurement data conveniently and at high measurement speed.

In this method for evaluating a semiconductor wafer, the failure in a device fabrication process can be abnormality related to residual film.

Accordingly, it is possible to prevent quality failure in a device fabrication process, and to effectively suppress yield decrease which would otherwise occur due to residual-film abnormality.

Here, a method for selecting a semiconductor wafer can be provided which further comprises a step of screening for, as a non-defective product, the mirror-polished wafer judged to have no possibility of failure incidence by the above-described method for evaluating a semiconductor wafer.

Thereby, wafers with high failure-incidence possibility can be discarded, so that the yield in a device fabrication process can be enhanced.

Here, a method for fabricating a device can be provided which comprises fabricating a device by using the mirror-polished wafer selected as a non-defective product by the above-described method for selecting a semiconductor wafer.

Thus, devices with higher quality can be fabricated in high yield.

Advantageous Effects of Invention

As described above, the inventive method for evaluating a semiconductor wafer makes it possible to simply and precisely identify a slice-cutting direction, and thereby precisely judge whether or not there will be a failure incidence in a device fabrication process.

BRIEF DESCRIPTION OF DRAWINGS

FIG. 3 shows diagrams for explaining a method for evaluating a semiconductor wafer according to the present invention.

FIG. 4 shows diagrams for explaining the inventive method for evaluating a semiconductor wafer.

FIG. 5 shows the evaluation results of Example and Comparative Example.

DESCRIPTION OF EMBODIMENTS

Figure 1:
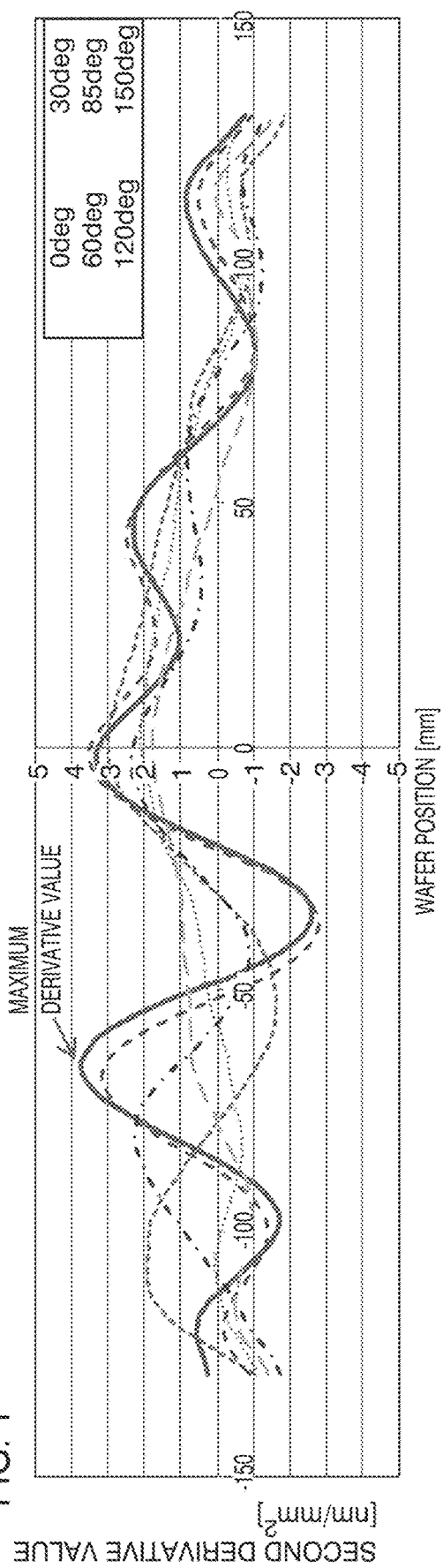
FIG. 1 shows differential profiles of multiple pieces of diameter-direction profile measurement data.

Hereinafter, the present invention will be described in detail, but the present invention is not limited thereto.

As noted above, there have been demands for a method for evaluating a semiconductor wafer by precisely and easily identifying a slice-cutting direction to enable effective detection and evaluation of peculiar wavy shape which is attributable to slicing step, and which has influence on failure incidence in a device fabrication process.

The present inventors have earnestly studied the above problems and consequently found that a method for evaluating a semiconductor wafer as follows can identify a slice-cutting direction precisely in a convenient manner, and whether or not there will be a failure incidence in a device fabrication process due to the influence of peculiar wavy shape attributable to slicing step can be precisely and conveniently aged on the basis of the identified slice-cutting direction. In this method for evaluating a semiconductor wafer, a mirror-polished wafer is used as the semiconductor wafer, and the method includes: a step of acquiring profile measurement data by measuring a profile of an entire surface in a thickness direction of the mirror-polished wafer with a wafer-profile measurement system; a step of identifying a slice-cutting direction of the mirror-polished wafer by extracting diameter-direction profile measurement data from the profile measurement data on the entire surface of the mirror-polished wafer, performing first-order or second-order differentiation on the extracted diameter-direction profile measurement data at a predetermined pitch to acquire differential profiles of the diameter-direction profile measurement data at predetermined rotation angles over the entire surface of the mirror-polished wafer, and comparing the acquired differential profiles of all pieces of the diameter-direction profile measurement data to determine that a diameter direction of the differential profile including a maximum derivative value is the slice-cutting direction; a step of acquiring x-y grid data by setting rectangular coordinates with coordinate axes being the identified slice-cutting direction and a direction perpendicular to the identified slice-cutting direction, performing first-order or second-order differentiation on profile measurement data at a predetermined pitch in a y-direction at a predetermined interval in an x-direction, where the y-direction is the identified slice-cutting direction and the x-direction is the direction perpendicular to the identified slice-cutting direction, and forming an x-y grid with predetermined intervals in the x-direction and the y-direction; a step including setting an intermediate region including a center of the mirror-polished wafer in the y-direction of the mirror-polished wafer and an upper-end-side region and a lower-end-side region located outside the intermediate region, and acquiring a maximum derivative value in the intermediate region of the mirror-polished wafer and a maximum derivative value in the upper-end-side region and the lower-end-side region of the mirror-polished wafer from the acquired x-y grid data; and a step of judging whether or not there is a possibility of failure incidence in a device fabrication process based on the maximum derivative value in the intermediate region and the maximum derivative value in the upper-end-side region and the lower-end-side region. This finding has led to the completion of the present invention.

Hereinbelow, description will be given with reference to the drawings.

As noted above, in order to screen for wafers having wavy shape that causes residual-film abnormality in a device fabrication process, first, it is necessary to identify the slice-cutting direction of a wire saw. The present inventors have examined first-order or second-order differential profiles in multiple diameter directions acquired from a wafer whose slice-cutting direction is known. Then, the inventors have found that the diameter direction including the maximum derivative value matches the cutting direction.

Figure 2:
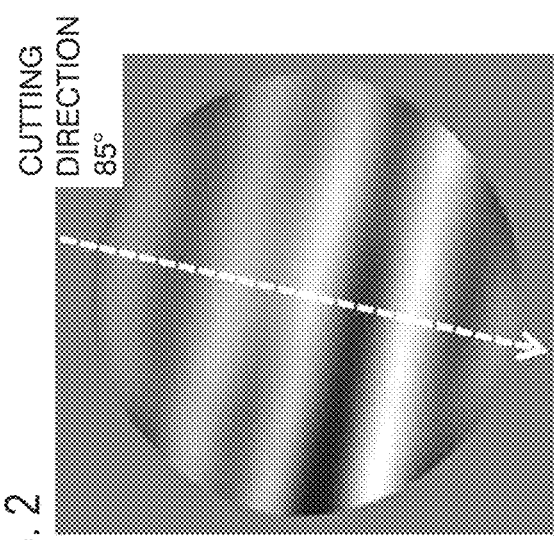
FIG. 2 shows an explanatory representation of a slice-cutting direction with a wire saw.

FIG. 1 shows the result of comparing differential profiles (here, the values are obtained by second-order differentiation) which are acquired from multiple pieces of diameter-direction profile measurement data over the entire in-plane region of a mirror-polished silicon wafer (PW) with a diameter of 300 mm. As shown in FIG. 1, it has been found that the diameter direction (in the example of FIG. 1, the direction is designated by 85°) of a differential profile having the maximum derivative value corresponds to the actual slice-cutting direction with a wire saw (see FIG. 2). The utilization of this fact allows precise and easy identification of the slice-cutting direction of a mirror-polished wafer.

(Step of Acquiring Profile Measurement Data)

FIGS. 3, 4 show diagrams for explaining the inventive method for evaluating a semiconductor wafer.

First, as shown in FIG. 3, a profile of a surface in a thickness direction of a mirror-polished wafer (FIG. 3 (*a*)) is entirely measured with a wafer-profile measurement system to acquire profile measurement data. The wafer-profile measurement system used in this event is not particularly limited, as long as a profile of an entire surface in a thickness direction of a wafer can be measured. Known wafer-profile measurement systems are usable. Particularly, a flatness measurement system or a nanotopography measurement system is preferably used. This is because these can conveniently and precisely obtain profile measurement data. In the subsequent process, evaluation is performed utilizing the profile measurement data acquired in this step.

(Step of Identifying Slice-Cutting Direction of Mirror-Polished Wafer)

Next, the slice-cutting direction of the mirror-polished wafer is identified. As shown in FIG. 3(*b*), profile measurement data in diameter directions are extracted from the acquired profile measurement data on the entire surface. Incidentally, here, as shown in FIG. 3(*b*), the angle (0°) is set as the reference. Nevertheless, as long as the slice-cutting direction is to be identified in the end, the reference may be set at any position. Subsequently, each of the extracted diameter-direction profile measurement data is subjected to first-order or second-order differentiation at every predetermined pitch, so that differential profiles of the diameter-direction profile measurement data are acquired. In this event, the pitch at which the differentiation is performed is not particularly limited, and can be 0.1 to 10 mm. Additionally, setting the lower limit value at, for example, 2 mm or more can reduce the influence of noise component. With such a range, more precise evaluation is possible. Further, the differentiation is more preferably second-order differentiation. This allows higher precision evaluation and judgement.

Such differential profiles of the diameter-direction profile measurement data are acquired over the entire surface of the mirror-polished wafer at every predetermined rotation angle. In this event, the rotation angle may be an angle pitch of higher than 0°, and is preferably a predetermined angle within a range of 0.5 to 10°, further preferably 1 to 5°. Within such ranges, more precise evaluation can be performed.

Next, the acquired differential profiles of all pieces of the diameter-direction profile measurement data are compared with one another. Then, the diameter direction of the differential profile including the maximum derivative value thereamong can be identified as the slice-cutting direction of the mirror-polished wafer.

(Step of Acquiring X-Y Grid Data)

After the slice-cutting direction of the mirror-polished wafer to be evaluated is identified, rectangular coordinates are set for this mirror-polished wafer as shown in FIG. 4(*a*), in which the identified slice-cutting direction and a direction perpendicular to the slice-cutting direction serve as coordinate axes. Then, differentiation is performed on the profile measurement data over the entire wafer surface and in a direction parallel to the slice-cutting direction to obtain a differential profile in a single direction (the slice-cutting direction).

In more details, first-order or second-order differentiation are performed on each profile measurement data at a predetermined pitch in a y-direction at a predetermined interval in an x-direction, where the y-direction is the slice-cutting direction, and the x-direction s the direction perpendicular to the slice-cutting direction. Then, an x-y grid is formed with a predetermined interval in the x-direction and a predetermined interval in the y-direction. Thus, x-y grid data is acquired. The size of the x-y grid can be optionally set within a range of approximately 0.1 mm to 10 mm. The predetermined intervals in the x-direction and the y-direction are preferably within a range of 0.5 to 2 mm, and the pitch at which the differentiation is performed in the y-direction is preferably within a range of 2 to 10 mm. With such ranges, the evaluation precision can be further enhanced. In addition, for more precise evaluation of the differential profiles of the profile measurement data on a wafer, the grid intervals in the x-direction and the y-direction are preferably smaller than the differentiation pitch. Particularly, the grid intervals are most preferably about. 1 mm. Note that the derivative values are more preferably calculated by second-order differentiation. This allows more precise evaluation and judgement.

(Step of Judging Whether or not there is Failure Incidence Possibility)

Next, as shown in FIG. 4 (*b*), an intermediate region including the center of the mirror-polished wafer and an upper-end-side region and a lower-end-side region located outside the intermediate region are set in the y-direction of the mirror-polished wafer. Then, a maximum derivative value in the intermediate region of the mirror-polished wafer and a maximum derivative value in the upper-end-side region and the lower-end-side region of the mirror-polished wafer are acquired from the acquired x-y grid data. The reason that intermediate region, the upper-end-side region, and the lower-end-side region are set as described above is as follows. While the cut length varies in the cutting initial and final stages of slice cutting, the cut length is long and the cutting proceeds relatively stably in the cutting middle stage. In addition, waviness in the cutting initial and final stages differs from that in the cutting middle stage. Accordingly, even if the same derivative values are obtained from these stages, the influence of a device fabrication process, for example, CMP step, on residual film differ, depending on whether the derivative value is present on the intermediate region of a wafer or present on the upper-end-side region and lower-end-side region. Hence, the judgement precision is enhanced by separately setting regions such as the intermediate region corresponding to the cutting middle stage and the upper-end-side and lower-end-side regions corresponding to the cutting initial and final stages, in comparison with unambiguously setting a certain standard for the grid data on the entire wafer surface. Note that, for a wafer with a diameter of 300 mm, the intermediate region may be a region covering an area 200 mm wide in the y-direction with respect to a straight line passing through the wafer center in the x-direction as the center (i.e., based on the straight line passing through the wafer center in the x-direction, the area is located ±100 mm in the y-direction); the upper-end-side and lower-end-side regions are preferably regions other than the intermediate region, that is, regions located approximately 4-50 mm inwardly (y-direction) of the wafer from both ends of the wafer in the y-direction (i.e., from end portions of the wafer which are on a straight line passing through the wafer center in the y-direction) (see FIG. 4(b)).

Then, whether or not there is a possibility of failure incidence in a device fabrication process is judged based on the maximum derivative value in the intermediate region and the maximum derivative value in the upper-end-side region and the lower-end-side region. As a judging method in this event, the judgement can be made based on, for example, whether or not the maximum derivative value in each region is within predetermined standard values, or whether or not a parameter, such as a ratio (Error %) of the number of grid data exceeding a predetermined threshold (Threshold value) relative to the total number of grid data in the entire wafer surface, is within predetermined, standard values. As the failure in a device fabrication process, for example, abnormality related to residual film in a CMP step in device fabrication is preferably adopted as an indicator. Note that, as the standard values set for the parameter employed in the judgement, it is possible to set values that can be effectively screened for based on a profile required from the user, etc.

(Step of Screening for Mirror-Polished Wafer as Non-Defective Product)

After whether or not the mirror-polished wafer has a failure incidence possibility in the device fabrication process is judged as described above, the mirror-polished wafer judged to have no failure incidence possibility can be effectively selected as a non-defective product. Moreover, when the mirror-polished wafer selected as a non-defective product is used to fabricate a device, this makes it possible to effectively suppress a failure in the subsequent step of the device fabrication process, particularly residual film failure incidence in the CMP step. Further, according to the inventive methods for evaluating and selecting a semiconductor wafer, wafers having a possibility of causing error in device pattern in photolithography step etc., other than the CMP step s can be screened for and removed in advance.

EXAMPLE

Hereinafter, the present invention will be described in detail with reference to Example. However, this does not limit the present invention.

As mirror-polished wafers to be evaluated in Example and Comparative Example, 44 silicon wafers (PW) each having a diameter of 300 mm were prepared. These silicon wafers were collected from multiple lots but for the same user. Moreover, to verify the effect of the inventive method for evaluating a semiconductor wafer, the 44 wafers included wafer products with or without wire saw breakage, and thus would differ in incidences of residual-film abnormality. With such wafers, the nanotopography standard judgement result (Comparative Example) processed with a single Gaussian filter was compared with the standard judgement result (Example) based on maximum derivative values in the intermediate region, upper-end-side region, and lower-end-side region composed of second-order derivative values in the slice-cutting direction.

First of all, as the wafer-profile measurement system, a flatness measurement system (WaferSight series manufactured by KLA Tencor) was used to acquire profile measurement data in the thickness direction of all the wafers. These profile measurement data were utilized for the evaluations in both of Example and Comparative Example.

Comparative Example

Based on the nanotopography values, the semiconductor wafers were evaluated to judge w ether or not failure would occur in the device fabrication process. Specifically, the flatness measurement system was used to acquire the profile measurement data in the thickness direction of each wafer, and filtering process with a single Gaussian filter (25 mm circle window) was performed on the data to obtain nanotopography values. As the condition of judging whether or not failure would occur in the device fabrication process, "the nanotopography value=38 nm" was set as the threshold. If the nanotopography value>38 nm, it was judged that there was a failure incidence possibility.

Example

Based on the inventive method for evaluating a semiconductor wafer, the slice-cutting direction of each wafer was determined, the x-y grid data was acquired, and the maximum derivative values in the intermediate region, upper-end-side region and lower-end-side region of the wafer were acquired. Specifically, the profile measurement data in the thickness direction of the wafer obtained with the flatness measurement system was used to acquire shape profiles in the diameter directions of the wafer. The data were subjected to second-order differentiation with a differentiation pitch=10 mm, and differential profiles of the diameter-direction profile measurement data were acquired. This process was performed over the entire surface of the wafer at rotation angles with 1° pitch. Thereby, second-order differential profile data on the entire surface were acquired. Next, among all the pieces of the second-order differential profile data, the diameter direction of the profile including the maximum derivative value was identified as the slice-cutting direction of the wafer.

The cutting direction thus identified was set as the y-direction in an x-y rectangular coordinate system, while the direction perpendicular to the cutting direction was set as the x-direction. Then, second-order differentiation was performed on the profile measurement data in the y-direction at fixed pitches with the differentiation pitch in the y-direction being 10 mm to acquire x-y grid data with the grid intervals in the x-direction and y-direction being 1 mm.

Next, the maximum derivative values were acquired in regions of the intermediate region and the upper-end-side region and lower-end-side region located the outside range of the intermediate region. The intermediate region covers a range ±100 mm (corresponding to 50 mm to 250 mm in the diameter the y-direction set on the wafer, and based on the straight line passing through the wafer center in the x-direction.

As the condition of judging whether or not there was a failure incidence possibility in the device fabrication process, the thresholds were set: "the maximum derivative value=5 nm/mm$^2$" for the intermediate region; and "the maximum derivative value=8 nm/mm$^2$" for the upper-end-side region and lower-end-side region. Specifically, the wafer was judged to have failure incidence possibility if either "the maximum derivative value in the intermediate region>5 nm/mm$^2$" or "the maximum derivative value in the upper-end-side region and lower-end-side region>8 nm/mm$^2$" was satisfied. In other words, it was judged to have no failure incidence possibility only when both "the maximum derivative value in the intermediate region≤5 nm/mm$^2$" and "the maximum derivative value in the upper-end-side region and lower-end-side region 8 nm/mm$^2$" were satisfied simultaneously.

FIG. 5 shows the evaluation results of Example and Comparative Example. FIG. 5(a) shows the results of evaluating the wafers based on the nanotopography values in Comparative Example. (b) and (c) in FIG. 5 are of the evaluation results of Example. FIG. 5(b) shows the maximum derivative values of the second-order differential profile data in the intermediate regions of the wafers. FIG. 5(c) shows the maximum derivative values of the second-order differential profile data in the upper-end-side and lower-end-side regions of the wafers. The thresholds adopted for each judgement are also shown in FIG. 5(a) to (c).

As shown in FIG. 5(a), out of the total of 44 wafers in the nanotopography-based judgement in Comparative Example, 6 wafers failed because of excessive judgement although these should have inherently passed (hereinafter, referred to as "excessively-judged wafers") (these were samples with no wire breakage and no residual film abnormality); meanwhile, 12 wafers passed because of insufficient judgement although these should have failed (hereinafter, referred to as "insufficiently-judged wafers") (these were samples with no wire breakage but with residual film abnormality). The excessive judgment percentage was 13.6%, and the insufficient judgment percentage was 27.3%.

Meanwhile, in the judgement by Example as shown in FIGS. 5(b) and (c), the number of excessively-judged wafers was decreased to 2, and the number of insufficiently-judged wafers was also decreased to 2. Both the excessive judgment percentage and the insufficient judgment percentage were improved to 4.5%.

As described above, in the evaluation and selection based on nanotopography in the Comparative Example, many wafers should have inherently passed but failed by the excessive judgement, and many wafers should have failed but passed by the insufficient judgement. In contrast, it was verified that both the excessive judgement and the insufficient judgement were ameliorated in the evaluation and selection according to the inventive evaluation method, and that wafers having wavy shape were more effectively selected in comparison with the nanotopography-based evaluation and selection, Thus, the inventive method for evaluating a semiconductor wafer detects wavy shape and is capable of more precisely screening for wafers that may cause residual film-related abnormality, in comparison with the conventional evaluation method of nanotopography-based evaluation and selection.

It should be noted that the present invention is not limited to the above-described embodiments. The embodiments are just examples, and any embodiments that substantially have the same feature and demonstrate the same functions and effects as those in the technical concept disclosed in claims of the present invention are included in the technical scope of the present invention.

The invention claimed is:

1. A method for evaluating a semiconductor wafer, wherein
a mirror-polished wafer is used as the semiconductor wafer, and
the method comprises:
a step of acquiring profile measurement data by measuring a profile of an entire surface in a thickness direction of the mirror-polished wafer with a wafer-profile measurement system;
a step of identifying a slice-cutting direction of the mirror-polished wafer by
extracting diameter-direction profile measurement data from the profile measurement data on the entire surface of the mirror-polished wafer,
performing first-order or second-order differentiation on the extracted diameter-direction profile measurement data at a predetermined pitch to acquire differential profiles of the diameter-direction profile measurement data at predetermined rotation angles over the entire surface of the mirror-polished wafer, and
comparing the acquired differential profiles of all pieces of the diameter-direction profile measurement data to determine that a diameter direction of the differential profile including a maximum derivative value is the slice-cutting direction;
a step of acquiring x-y grid data by
setting rectangular coordinates with coordinate axes being the identified slice-cutting direction and a direction perpendicular to the identified slice-cutting direction,
performing first-order or second-order differentiation on profile measurement data at a predetermined pitch in a y-direction at a predetermined interval in an x-direction, where the y-direction is the identified slice-cutting direction and the x-direction is the direction perpendicular to the identified slice-cutting direction, and
forming an x-y grid with predetermined intervals in the x-direction and the y-direction;
a step including
setting an intermediate region including a center of the mirror-polished wafer in the y-direction of the mirror-polished wafer and an upper-end-side region and a lower-end-side region located outside the intermediate region, and
acquiring a maximum derivative value in the intermediate region of the mirror-polished wafer and a maximum derivative value in the upper-end-side region and the lower-end-side region of the mirror-polished wafer from the acquired x-y grid data; and
a step of judging whether or not there is a possibility of failure incidence in a device fabrication process based on the maximum derivative value in the intermediate region and the maximum derivative value in the upper-end-side region and the lower-end-side region.

2. The method for evaluating a semiconductor wafer according to claim 1, wherein the extraction of the diameter-direction profile measurement data and the acquisition of the differential profiles are performed at a predetermined rotation angle that is an interval of 0.5 to 10°.

3. The method for evaluating a semiconductor wafer according to claim 1, wherein the predetermined intervals in the x-direction and the y-direction in the x-y grid are 0.5 to 2 mm.

4. The method for evaluating a semiconductor wafer according to claim 2, wherein the predetermined intervals in the x-direction and the y-direction in the x-y grid are 0.5 to 2 mm.

5. The method for evaluating a semiconductor wafer according to claim 1, wherein the predetermined differentiation on the x-y grid in the y-direction is performed at a pitch of 2 to 10 mm.

6. The method for evaluating a semiconductor wafer according to claim 2, wherein the predetermined differentiation on the x-y grid in the y-direction is performed at a pitch of 2 to 10 mm.

7. The method for evaluating a semiconductor wafer according to claim 3, wherein the predetermined differentiation on the x-y grid in the y-direction is performed at a pitch of 2 to 10 mm.

8. The method for evaluating a semiconductor wafer according to claim 4, wherein the predetermined differentiation on the x-y grid in the y-direction is performed at a pitch of 2 to 10 mm.

9. The method for evaluating a semiconductor wafer according to claim 1, wherein a flatness measurement system or a nanotopography measurement system is used as the wafer-profile measurement system.

10. The method for evaluating a semiconductor wafer according to claim 2, wherein a flatness measurement system or a nanotopography measurement system is used as the wafer-profile measurement system.

11. The method for evaluating a semiconductor wafer according to claim 3, wherein a flatness measurement system or a nanotopography measurement system is used as the wafer-profile measurement system.

12. The method for evaluating a semiconductor wafer according to claim 4, wherein a flatness measurement system or a nanotopography measurement system is used as the wafer-profile measurement system.

13. The method for evaluating a semiconductor wafer according to claim 5, wherein a flatness measurement system or a nanotopography measurement system is used as the wafer-profile measurement system.

14. The method for evaluating a semiconductor wafer according to claim 6, wherein a flatness measurement system or a nanotopography measurement system is used as the wafer-profile measurement system.

15. The method for evaluating a semiconductor wafer according to claim 7, wherein a flatness measurement system or a nanotopography measurement system is used as the wafer-profile measurement system.

16. The method for evaluating a semiconductor wafer according to claim 8, wherein a flatness measurement system or a nanotopography measurement system is used as the wafer-profile measurement system.

17. The method for evaluating a semiconductor wafer according to claim 1, wherein the failure in a device fabrication process is abnormality related to residual film.

18. A method for selecting a semiconductor wafer, further comprising a step of screening for, as a non-defective product, the mirror-polished wafer judged to have no possibility of failure incidence by the method for evaluating a semiconductor wafer according to claim 1.

19. A method for fabricating a device, comprising fabricating a device by using the mirror-polished wafer selected as a non-defective product by the method for selecting a semiconductor wafer according to claim 18.

* * * * *